United States Patent [19]

New

[11] Patent Number: 6,154,052

[45] Date of Patent: Nov. 28, 2000

[54] COMBINED TRISTATE/CARRY LOGIC MECHANISM

[75] Inventor: Bernard J. New, Los Gatos, Calif.

[73] Assignee: Xilinx, Inc., San Jose, Calif.

[21] Appl. No.: 09/244,441

[22] Filed: Feb. 4, 1999

[51] Int. Cl.⁷ .............................................. H03K 19/177
[52] U.S. Cl. .............................................. 326/41; 326/38
[58] Field of Search .......................................... 326/37–41

[56] References Cited

U.S. PATENT DOCUMENTS

| | | | |
|---|---|---|---|
| Re. 34,363 | 8/1993 | Freeman et al. | 307/465 |
| 5,349,250 | 9/1994 | New | 307/465 |
| 5,365,125 | 11/1994 | Goetting et al. | 326/41 |
| 5,546,018 | 8/1996 | New et al. | 326/41 |
| 5,629,886 | 5/1997 | New | 364/787 |
| 5,675,262 | 10/1997 | Duong et al. | 326/41 |
| 5,677,638 | 10/1997 | Young et al. | 326/39 |

*Primary Examiner*—Michael Tokar
*Assistant Examiner*—Don Phu Le

*Attorney, Agent, or Firm*—William L. Paradice, Esq.; Lois D. Cartier

[57] ABSTRACT

In an FPGA having a tristate bus structure formed by a multiplexer chain extending across a plurality of logic units, a programmable function generator is provided to interface between the input and enable signal lines of logic units and the corresponding multiplexer's input and control terminals and is coupled to receive a mode control signal. When the mode control signal is in a first logic state, the function generator couples the input and enable signals to the corresponding multiplexer input and control terminals to emulate a tristate input bus. When the mode control signal is in a second logic state, the function generator receives first and second data signals from corresponding input and enable lines. In response thereto, the function generator couples one of the data signals to the corresponding multiplexer input terminal and provides an exclusive-OR logic function of the first and second data signals to the corresponding multiplexer control terminal. In this manner, each multiplexer stage provides a carry signal to the next multiplexer stage, thereby forming a carry path in the horizontal direction across the FPGA.

31 Claims, 5 Drawing Sheets

COMBINED TRISTATE/CARRY LOGIC MECHANISM

FIELD OF THE INVENTION

This invention relates generally to programmable gate arrays and specifically to a carry logic and bus structure of a programmable gate array.

BACKGROUND OF THE INVENTION

A field programmable gate array (FPGA) includes a plurality of configurable logic blocks (CLBs) and a configurable interconnect structure for connecting the CLBs to one another and otherwise routing signals through the FPGA. The overall structure of an FPGA is described by Freeman in U.S. Pat. No. Re. 34,363, incorporated herein by reference. The tristate bus and carry logic structure of a FPGA are typically orthogonal to one another. Specifically, dedicated tristate buses run in a horizontal direction along the bit slices of an FPGA as described, for instance, in U.S. Pat. No. 5,677,638, incorporated herein by reference, while dedicated carry logic runs in a vertical direction across the bit slices of an FPGA as described, for instance, in U.S. Pat. No. 5,629,886, incorporated herein by reference.

An FPGA 10 of the type described in U.S. Pat. No. 5,677,638 having an emulated tristate bus structure formed in the horizontal direction along bit slices is shown in FIG. 1. The FPGA 10 includes a plurality of logic units 11 each having a CLB 12, a multiplexer 13, a data line I, and an enable line E. The CLBs 12, each of which may, for instance, be configured to add two 4-bit numbers to produce a 4-bit sum and a 1-bit carry signal, communicate with one another and other components (not shown) of the FPGA 10 using an interconnect structure 14. The multiplexers 13 of adjacent logic units 11 are cascaded together to form a chain across corresponding logic units 11, where the second input and control terminals of the multiplexers 13 are connected to associated input data and input enable lines I and E, respectively. The output of the final multiplexer in the chain can be routed back to any bit slice requiring the tristate output value as an input.

Data signals are provided on respective input lines I1–I8 and corresponding enable signals are provided on respective enable lines E1–E8. If none of the enable signals on lines E1–E4 are asserted, then the output signal from multiplexer 15a is forwarded through multiplexer chain 13a–13d and buffer 19a to line 17b. If, on the other hand, an enable signal on one of lines E1–E4 is asserted, then the input signal on the corresponding multiplexer input line I appears on bus line 17b. In this manner, the multiplexer chain 13a–13d forms a tristate bus across logic units 11a–11d, thereby allowing one of the input signals on respective lines I1–I4 to drive the bus line 17b. The multiplexer chain 13e–13h forms a tristate bus across logic units 11e–11h in a similar manner.

Adjacent multiplexer chains are selectively coupled together using contacts 14 and multiplexers 15 to form longer multiplexer chains. Predetermined values stored in memories 16 control respective multiplexers 15. For instance, when the value stored in memory 16a is "0", multiplexer 15a couples the signal on line 17a to the first input terminal of the multiplexer 13a, thereby connecting the chain of multiplexers 13a–13d to the multiplexer chain to the left (not shown). On the other hand, when the value in memory 16a is "1", multiplexer 15a couples the signal on line 18a to the multiplexer 13a, thereby sourcing a signal from either the interconnect structure or ground potential. Thus, if the value stored in memory 16b is a logic "0" and if the contact 14b is not electrically coupled to the interconnect structure 14, then multiplexers 13a–13h form a common, 8-input tristate bus across logic units 11a–11h.

A carry logic circuit 20 employed within a CLB of the type described in U.S. Pat. No. 5,629,886 is shown in FIG. 2. The carry logic circuit 20 includes one bit of a carry chain that runs in the vertical direction to propagate carry signals across bit slices of input signals A and B. Note that the sum information, which travels horizontally from input lines $A_i$, $B_i$ to sum line $S_i$, runs orthogonal to the carry information, which travels vertically from input line $C_i$ to the output line $C_{i+1}$.

The dedicated bus structure, carry logic, and sum logic of conventional FPGA structures are well suited for performing a number of programmable functions, including addition and subtraction, where the carry information runs orthogonal to the sum information. However, when implementing more complicated functions such as, for instance, a carry-save multiplier, the above-described structure is restrictive. For instance, where it is desired to multiply two 8-bit numbers X[7:0]*Y[7:0], the first number X[7:0] is logically ANDed with each bit of the second number Y[n] to produce eight 8-bit partial products. These partial products, which may be temporarily stored in an array 30, as depicted in FIG. 3, are then combined to form a 16-bit sum of products Z[15:0], i.e., X[7:0]*Y[7:0]=Z[15:0]. When combining the partial products using the well-known carry-save technique to reduce delay, sum information travels diagonally through the array 30, as indicated in FIG. 3 by the SUM arrow. Carry information propagates horizontally through each of the 8 rows of the array 30, as indicated in FIG. 3 by the horizontal CARRY arrows. The sum information is combined with the eight row carry bits in a single adder, as modeled by the rightmost column of the array 30, whereby the final carry bits propagate in the vertical direction through the array 30, as indicated by the single vertical CARRY arrow in FIG. 3. Accordingly, since carry information travels in both the vertical and horizontal directions in a carry-save multiplier circuit, it is desirable to provide an FPGA having carry paths in such orthogonal directions. Further, since silicon area is expensive, it would be desirable for such a structure to require minimal circuit components.

SUMMARY OF THE INVENTION

A structure is disclosed that provides a horizontal carry path in an FPGA without a significant increase in die size. In accordance with the present invention, a programmable function generator is provided in an FPGA to interface between the input and enable signal lines and the corresponding multiplexer of a multiplexer-chain bus structure, where the output terminal of each multiplexer is coupled to the first input terminal of the next multiplexer. The programmable function generator includes first and second input terminals coupled to corresponding input and enable signal lines, a third input terminal coupled to receive a mode control signal, and first and second output terminals coupled to the second input and control terminals of the corresponding multiplexer. When the mode control signal is in a first logic state, the programmable function generator couples the input and enable signals to the corresponding multiplexer input and control terminals, thereby allowing the multiplexer chain to function as a tristate bus. When the mode control signal is in a second logic state, the programmable function generator receives first and second data signals from corresponding input I and enable E lines. In response thereto, the programmable function generator couples one of the data signals to the corresponding multiplexer's input terminal and provides an exclusive-OR logic function of the first and second data signals to the corresponding multiplexer control terminal. If the first and second data signals are equal, the multiplexer forwards the data signal to its output terminal as a carry-out signal. If, on the other hand, the first and second data signals are not equal, the multiplexer forwards a carry-in signal from its first input terminal to its output terminal as the carry-out signal. In this manner, the present invention utilizes an existing FPGA bus structure to implement a carry path in the horizontal direction, i.e., along bit slices of the FPGA.

Some embodiments include a second programmable function generator having first and second input terminals coupled to the first input and control terminals of the corresponding multiplexer, a third input terminal coupled to receive the mode control signal, and an output terminal coupled to provide an output signal. When the mode control signal is in the first logic state, the second programmable function generator provides an output for the bus signal received at the first input terminal of the corresponding multiplexer. When the mode control signal is in the second state, the second programmable function generator exclusive-ORs the signals at the corresponding multiplexer's first input and control terminals to provide a sum signal. In this manner, embodiments of the present invention implement a full adder circuit.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Embodiments of the present invention are described below in the context of an FPGA for simplicity only. It is to be understood that embodiments of the present invention are equally applicable to other structures that implement logic functions such as, for instance, an arithmetic logic unit (ALU). Accordingly, the present invention is not to be construed as limited to the specific examples herein, but rather includes within its scope all embodiments defined by the appended claims.

Figure 4:
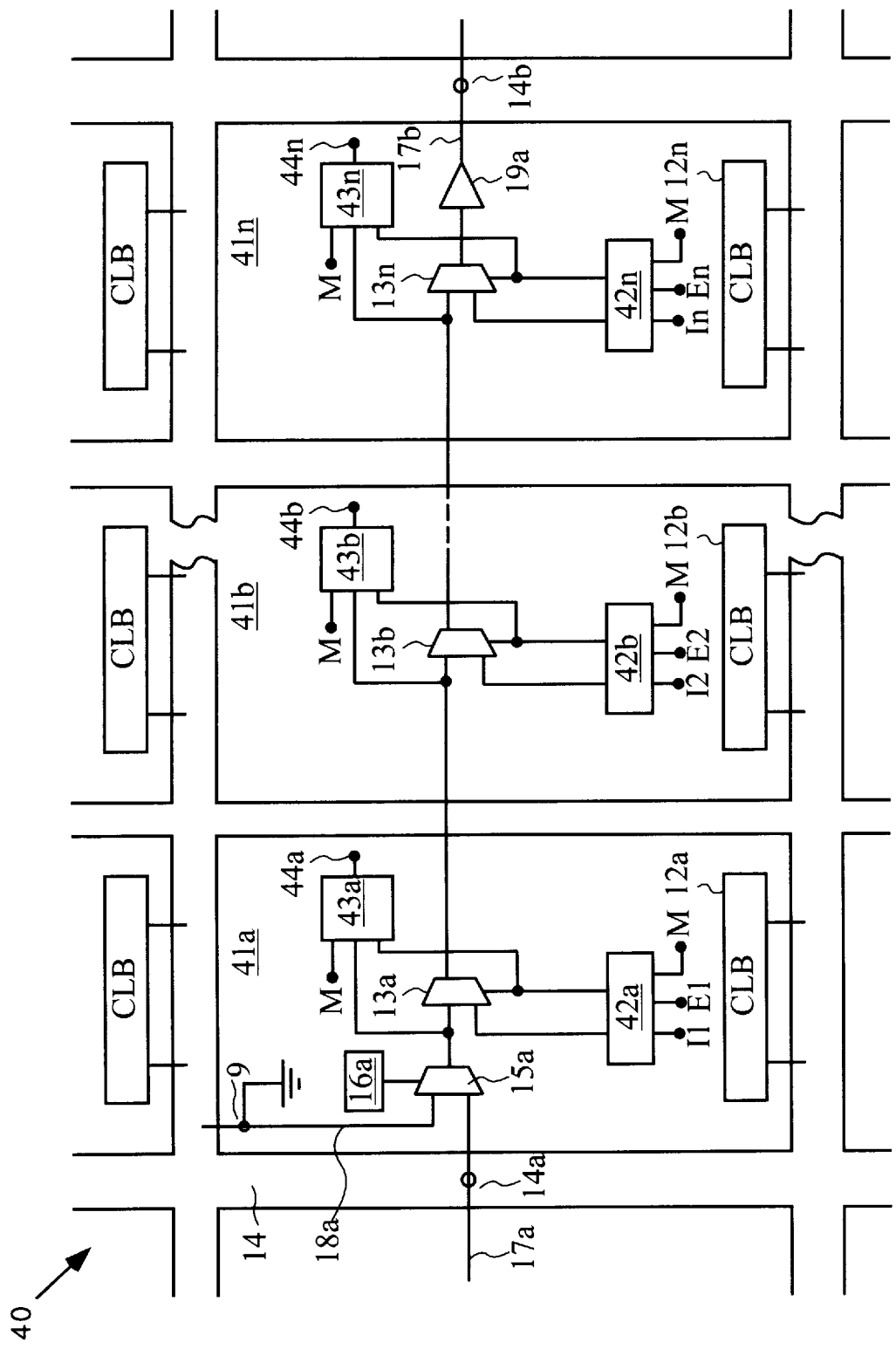
FIG. 4 is a block diagram of a tristate bus and logic structure in accordance with the present invention.

FIG. 4 shows a tristate bus and carry logic structure of the present invention implemented within an FPGA 40 having a plurality of CLBs 12 positioned in corresponding logic units 41. In preferred embodiments, each logic unit 41 includes a first programmable function generator 42 and a second programmable function generator 43.A chain of multiplexer stages 13a–13n is provided across corresponding logic units 41a–41n in a horizontal direction. Each multiplexer 13 has an output terminal coupled to the first input terminal of the next multiplexer 13, a second input terminal coupled to receive a data signal from a corresponding first function generator 42, and a control terminal coupled to receive a control signal from the corresponding first function generator 42.

Each first function generator 42 includes first and second input terminals coupled to the input and enable lines I1–In and E1–En, respectively, of the corresponding logic unit 41, and a third input terminal coupled to receive a mode control signal M. In response to the mode control signal M, the first function generator 42 selectively provides first and second logic functions of the signals received on the corresponding input lines I and enable lines E to the second input terminal and control terminal of the corresponding multiplexer stage 13.

Each second programmable function generator 43 includes first and second input terminals coupled to the first input terminal and control terminal of the corresponding multiplexer stage 13, and further includes a third input terminal coupled to receive the mode control signal M and an output terminal coupled to a contact 44, which may be, for instance, suitably provided to an associated circuit.

In response to a predetermined value stored in memory 16a, multiplexer 15a selectively couples the first input terminal of multiplexer 13a to receive either the signal on line 18a, which may in turn be coupled to ground potential or to the general interconnect structure 14 via a switch 9, or a signal from a multiplexer chain (not shown) from the left via line 17a. Thus, multiplexer 15a determines the source of the signal provided to respective input terminals of multiplexer stage 13a and second function generator 43a. In this manner, multiplexer stages 13 in common rows of the FPGA 40 may be selectively connected together.

When it is desired to emulate a tristate input bus across a row of logic units 11, i.e., along bit slices of the FPGA 40, the mode control signal M is set to a first logic state. In response thereto, each first function generator 42 forwards the data signal on its input line I to the second input terminal of the corresponding multiplexer stage 13, and forwards the enable signal on its enable line E to the control terminal of the corresponding multiplexer stage 13.Thus, if none of the enable signals on enable lines El–En are asserted, the signal sourced from multiplexer 15a is forwarded through multiplexers 13a–13n and to buffer 19a, which, in turn, drives the signal onto line 17b. If, on the other hand, one of the enable signals on respective enable lines El–En is asserted, the data signal on the corresponding input line I is provided to the first input terminal of the next multiplexer stage 13 and thereafter forwarded to line 17b as described above. In this manner, present embodiments allow for the emulation of a conventional tristate input bus along bit slices of an FPGA. For additional discussion of emulated tristate bus structures and the advantages thereof, see U.S. Pat. No. 5,677,638.

In some embodiments, the second function generators 43a–43n are configured such that when mode control signal M is in the first logic state, each second function generator forwards the signal received on its first input terminal to the corresponding contact 44.In this manner, bus line taps are available at each logic unit 41.In some embodiments, these bus line taps may be routed to additional circuitry (not shown) of FPGA 40 using, for instance, interconnect structure 14.

When it is desired to implement a carry logic path across a row of logic units 41, i.e., along bit slices, mode control signal M is set to a second logic state. In accordance with the present invention, multiplexer chain 13 and first function generator 42 provide a horizontal carry path within an FPGA and thereby allow for implementation of complicated functions such as carry-save multipliers. First data signals A1–An are provided on respective input lines I1–In, and second data signals B1–Bn are provided on respective enable lines E1–En. Where multiplexer 13a is used for the least significant bit (LSB) in an adder circuit, multiplexer 15a provides a binary "0" carry-in signal from line 18a to the first input terminal of multiplexer 13a. If multiplexer 13a is not used for the LSB in an adder circuit, multiplexer 15a provides a carry-in signal C1 from the multiplexer chain (not shown) to the left via line 17a to the first input terminal of multiplexer 13a.

LSB first function generator 42a passes data signal A1 to the second input terminal of the corresponding multiplexer stage 13a and provides a propagate signal P1 to the control terminal of the corresponding multiplexer stage 13a, where the propagate signal P1 is a logical exclusive-OR (XOR) function of data signals A1 and B1, i.e., P1=A1 ⊕B1. Multiplexer 13a couples either the carry-in signal C1 from multiplexer 15a or data signal A1 to the first input terminal of the next multiplexer stage 13b, depending on the binary state of the propagate signal P1. If the binary values of respective data signals A1 and B1 are not equal, multiplexer stage 13a propagates the carry-in signal C1 received from multiplexer 15a to its output terminal as a carry signal C2 to the more significant bit, i.e., the next multiplexer 13b. If, on the other hand, the binary values of respective data signals A1 and B1 are equal, multiplexer stage 13a forwards data signal A1 to its output terminal as the carry signal C2 to the next multiplexer stage 13b. (Data signal A1 is logically equivalent to "generate" whenever data signal A1 is selected.) In this manner, multiplexer 13a provides at its output terminal a carry-out signal C2 resulting from the addition of the data signals A1 and B1.

Figure 1:
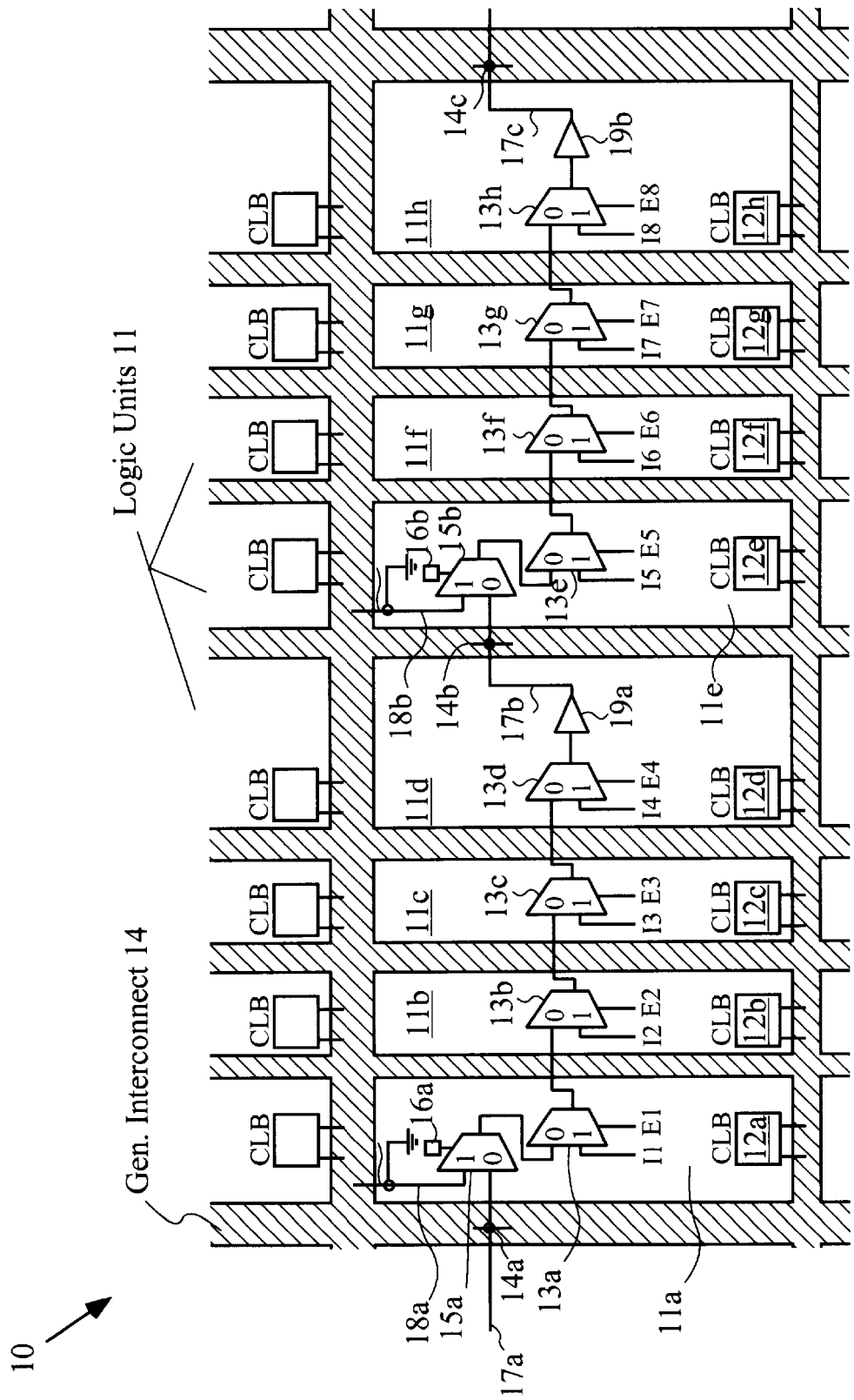
FIG. 1 is a block diagram of a conventional FPGA illustrating a tristate bus structure in the horizontal direction.
Figure 2:
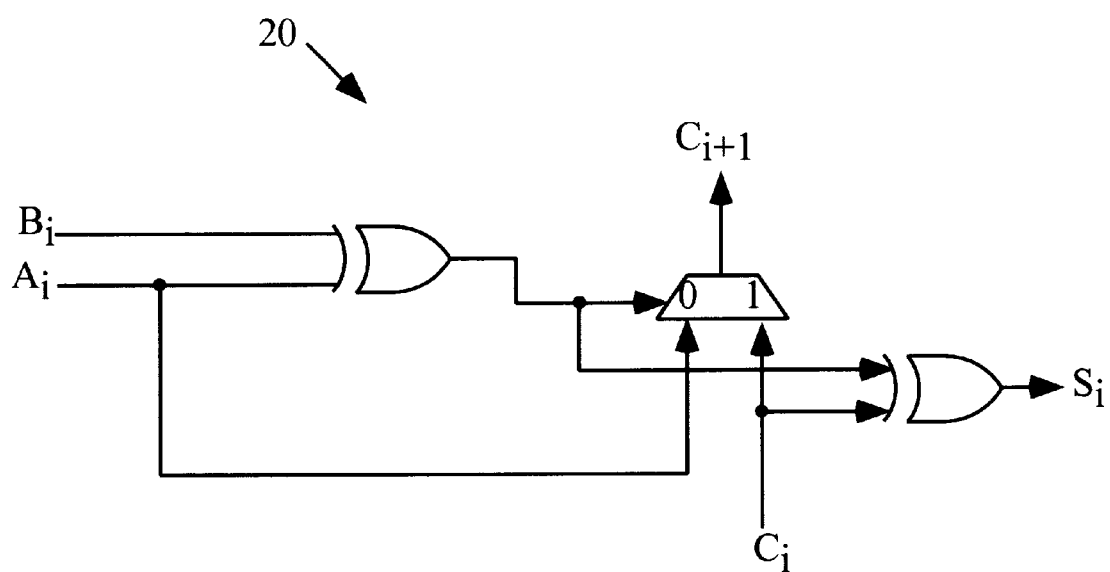
FIG. 2 is a block diagram of a conventional FPGA illustrating a carry logic path in the vertical direction.
Figure 3:
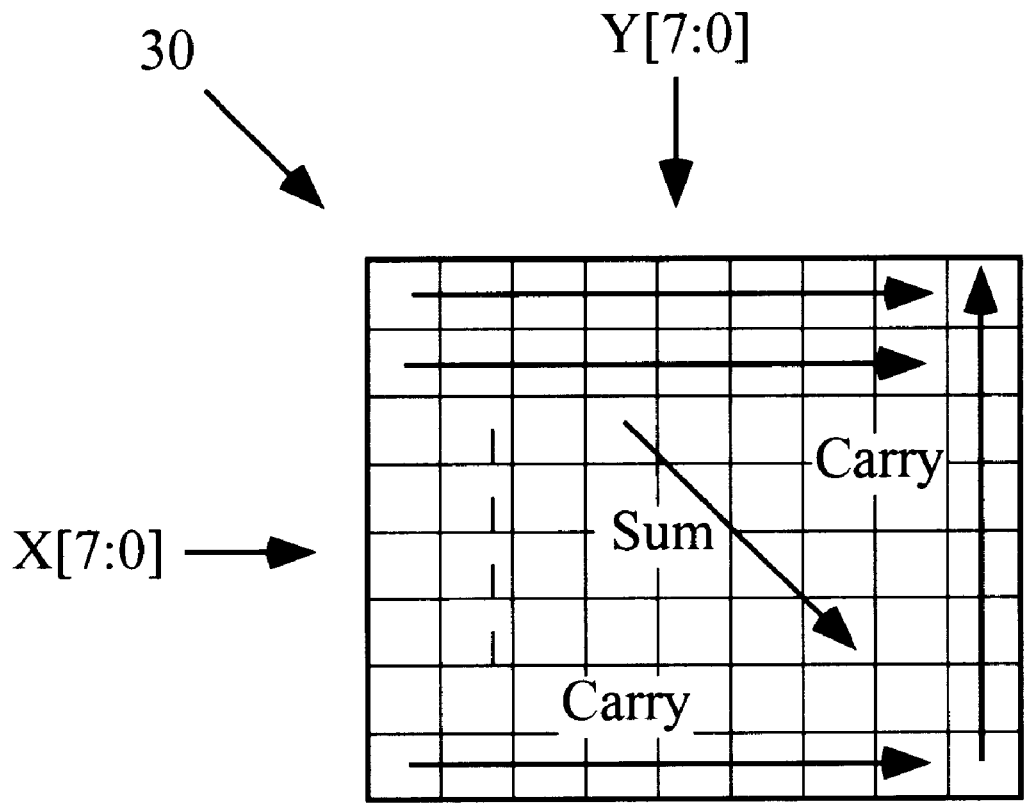
FIG. 3 is a block diagram of an array illustrating sum and carry paths of a carry-save multiplier circuit.

The carry signal C2 output by multiplexer stage 13a is received at the first input terminal of the second multiplexer stage 13b. The first function generator 42b associated therewith provides a propagate signal P2=A2 ⊕ B2 to the control terminal of multiplexer stage 13b, which, in turn, provides a carry signal C3 to the next multiplexer stage 13c in the manner described above. Carry propagation continues in this manner until a final carry signal Cn+1 is provided to either general interconnect structure 14 or to a multiplexer chain to the right (not shown), depending on the configuration of selective connector 14b. In this manner, present embodiments implement a carry logic path across logic units 41.Note that the present carry logic path runs in the horizontal direction, and thus is orthogonal to carry logic paths provided in the CLBs 12, which, as described above with respect to FIG. 1, run in the vertical direction.

LSB second function generator 43a combines the carry-in signal C1 received from the multiplexer 15a and the propagate signal P1 received from associated first function generator 42a according to a logic XOR function to produce a sum signal S1 at the corresponding contact 44a. The sum signal S1 is indicative of the addition of data signals A1 and B1, where S1=C1 ⊕ A1 ⊕ B1=C1 ⊕ P1, where P1=A1 ⊕ B1. Second function generators 43b–43n provide corresponding sum signals S2–Sn in a similar manner. In this manner, the second function generators 43a–43n provide the sum bits of an n-bit full adder circuit. Note that the sum signals S1–Sn provided by respective second function generators 43a–43n may be routed to additional circuitry (not shown) using, for instance, interconnect structure 14.

A truth table illustrating the operation of a full adder, implemented by present embodiments as described above, is set forth in Table 1.

TABLE 1

| A1 | B1 | C1 | P1 | S1 | C2 |
|----|----|----|----|----|----|
| 0  | 0  | 0  | 0  | 0  | 0  |
| 0  | 0  | 1  | 0  | 1  | 0  |
| 0  | 1  | 0  | 1  | 1  | 0  |
| 0  | 1  | 1  | 1  | 0  | 1  |
| 1  | 0  | 0  | 1  | 1  | 0  |
| 1  | 0  | 1  | 1  | 0  | 1  |
| 1  | 1  | 0  | 0  | 0  | 1  |
| 1  | 1  | 1  | 0  | 1  | 1  |

The embodiment shown in FIG. 4 advantageously provides a carry logic path in the horizontal direction along bit slices of FPGA 40.As mentioned above, when using an FPGA to implement a carry save multiplier, it is necessary for carry logic paths to run both in the vertical direction, as provided by dedicated structures within CLBs 12, and in the horizontal direction, as facilitated by multiplexer stages 13 and associated function generators 42 in accordance with the present invention. Further, since present embodiments utilize existing multiplexer chains of a tristate bus structure, present embodiments require the addition of only the first function generators 42 to implement the horizontal carry path of the present invention. If desired, the second function generators may be added to facilitate sum circuitry in connection with the above-described carry logic path. Otherwise, the sum circuitry can be implemented in function generators provided by the FPGA for conventional logic emulation. Accordingly, the advantages of the present invention are realized with minimal circuitry, thereby conserving valuable die area.

Figure 5:
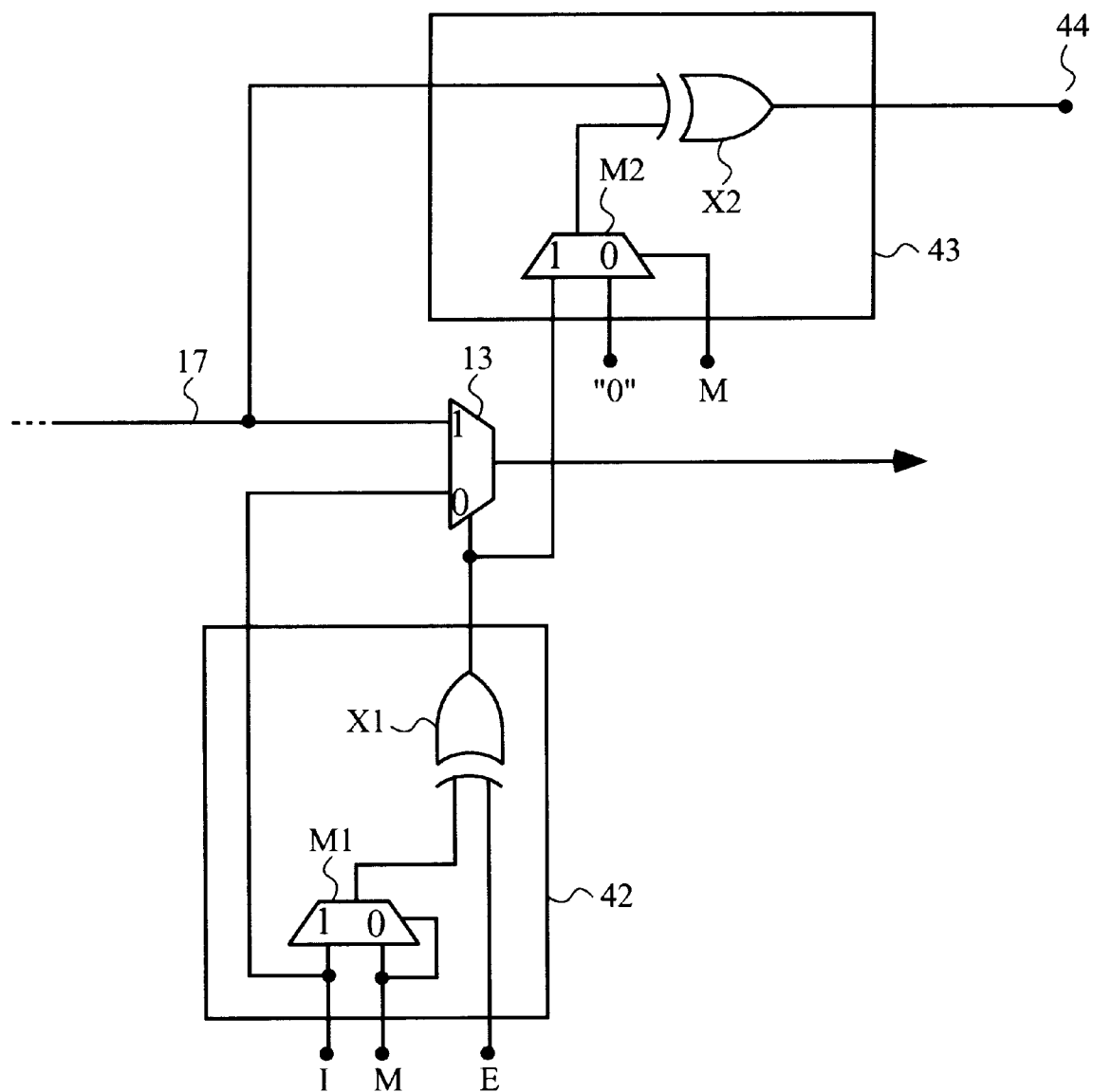
FIG. 5 is a schematic diagram of one embodiment of the structure of FIG. 3.

FIG. 5 shows one embodiment of the structure of FIG. 4, where the first function generator 42 includes a multiplexer M1 and an exclusive-OR gate X1, and the second function generator 43 includes a multiplexer M2 and an exclusive-OR gate X2.In this embodiment, when the mode control signal M is logic "0", the multiplexer M1 forwards that logic "0" signal to the XOR gate X1 which, in response thereto, passes the enable signal on line E to the control terminal of multiplexer stage 13.In this manner, multiplexer stage 13 functions as a tristate input bus for an input signal on input line I according to the corresponding enable signal on enable line E, as described above. In response to the logic low mode control signal M, multiplexer M2 of second function generator 43 passes an input signal "0" to XOR gate X2, which passes the signal on bus line 17 to the contact 44.

When the mode control signal is a logic "1", multiplexer M1 passes the data signal on input line I to XOR gate X1, where it is combined with the data signal on enable line E to provide a propagate signal P to the control terminal of multiplexer stage 13. If the data signals are equal, multiplexer stage 13 passes the data value on input line I to the next multiplexer stage (not shown) as the carry signal. Otherwise, multiplexer 13 passes the signal received from line 17 as the carry signal. In response to the logic high mode control signal M, multiplexer M2 passes the propagate signal P received from XOR gate X1 to XOR gate X2, which combines the carry-in signal received from line 17 with the propagate signal P to provide a sum signal S at contact 44.

In another embodiment (not shown), the select signal and the "0" data input signal of multiplexer M1 are provided by two different mode signals. The select signal selects between tristate emulation and carry operation. When tristate operation is selected, the "0" data input signal operates as a polarity control for enable line E.

While particular embodiments of the present invention have been shown and described, it will be obvious to those skilled in the art that changes and modifications may be made without departing from this invention in its broader aspects and, therefore, the appended claims encompass within their scope all such changes and modifications as fall within the true spirit and scope of this invention.

What is claimed is:

1. A multiplexer structure having a plurality of signal-select multiplexer stages, each comprising:

a signal-select multiplexer having an output terminal coupled to a first input terminal of a next signal-select multiplexer, a first input terminal coupled to an output terminal of a previous signal-select multiplexer, a second input terminal, and a control terminal; and a programmable function generator having a first output terminal coupled to the second input terminal of the signal-select multiplexer, a second output terminal coupled to the control terminal of the signal-select multiplexer, a first input terminal coupled to an input line of the stage, a second input terminal coupled to an enable line of the stage, and a third input terminal coupled to receive a mode select control signal;

and wherein in each multiplexer stage:

in a first mode the programmable function generator selectively couples the signal-select multiplexer's output terminal to one of the first and second signal-select multiplexer input terminals in response to an enable signal on the enable line; and in a second mode the programmable function generator selectively couples the signal-select multiplexer's output terminal to one of the first and second signal-select multiplexer input terminals in response to a logical combination of a first data signal on the input line and a second data signal on the enable line.

2. The structure of claim 1, wherein the logical combination comprises an XOR function.

3. The structure of claim 2, wherein the programmable function generator comprises an XOR gate having:

a first input terminal selectively coupled to the input line or to receive the mode control signal:

a second input terminal coupled to the enable line; and an output terminal coupled to the control terminal of the signal-select multiplexer.

4. The structure of claim 3, wherein the programmable function generator further comprises a mode-select multiplexer having:

a first input terminal coupled to the input line;

a second input terminal coupled to receive the mode control signal;

an output terminal coupled to the first input terminal of the XOR gate; and a control terminal coupled to receive the mode select control signal.

5. The structure of claim 3, wherein the programmable function generator further comprises a mode-select multiplexer having:

a first input terminal coupled to the input line;

a second input terminal coupled to receive a polarity control signal controlling polarity of the enable line;

an output terminal coupled to the first input terminal of the XOR gate; and a control terminal coupled to receive the mode select control signal.

6. The structure of claim 1, wherein each signal-select multiplexer stage further comprises a second programmable function generator having:

an output terminal coupled to an output port of the signal-select multiplexer stage;

a first input terminal coupled to the first input terminal of the signal-select multiplexer;

a second input terminal coupled to the control terminal of the signal-select multiplexer; and a third input terminal coupled to receive the mode select control signal.

7. The structure of claim 6, wherein:

in a first mode the second programmable function generator selectively couples the output port to a bus signal at the first signal-select multiplexer input terminal; and in a second mode the programmable function generator couples the output port to a logical combination of signals received at the first input and control terminals of the signal-select multiplexer.

8. The structure of claim 7, wherein the logical combination comprises an XOR function.

9. The structure of claim 8, wherein the second programmable function generator comprises an XOR gate having:

a first input terminal coupled to the first input terminal of the signal-select multiplexer;

a second input terminal selectively coupled to receive either a signal from the control terminal of the signal-select multiplexer or a predetermined signal; and an output terminal coupled to the output port of the signal-select multiplexer stage.

10. The structure of claim 9, wherein the second programmable function generator further comprises a second mode-select multiplexer having:

a first input terminal coupled to receive the predetermined signal;

a second input terminal coupled to receive the signal at the control terminal of the signal-select multiplexer;

an output terminal coupled to the second input terminal of the XOR gate; and a control terminal coupled to receive the mode select control signal.

11. A field programmable gate array, comprising:

a plurality of configurable logic blocks (CLBs), each having first and second output terminals and including one or more carry logic circuits configured to propagate carry signals in a vertical direction across the gate array;

a multiplexer chain coupled across the CLBs in a horizontal direction, the multiplexer chain including a plurality of multiplexers each having an output terminal coupled to a first input terminal of a next multiplexer of the multiplexer chain, a first input terminal coupled to an output terminal of a previous multiplexer of the multiplexer chain, a second input terminal, and a control terminal; and a plurality of programmable function generators each having a first input terminal selectively coupled to the first output terminal of an associated CLB, a second input terminal selectively coupled to the second output terminal of the associated CLB, a first output terminal coupled to the second input terminal of an associated multiplexer, a second output terminal coupled to the control terminal of the associated multiplexer, and a third input terminal coupled to receive a mode select control signal, and wherein:

in a first mode each program function generator facilitates emulation of a tristate bus in a horizontal direction across the CLBs; and in a second mode the program function generator facilitates a carry logic path in the horizontal direction across the CLBs.

12. The gate array of claim 11, wherein:

in the first mode each programmable function generator couples the first and second output terminals of the associated CLB to the second input and control terminals of the associated multiplexer, respectively; and in the second mode each programmable function generator couples the first output terminal of the associated CLB to the second input terminal of the associated multiplexer, and provides a logical combination of signals received from the first and second output terminals of the associated CLB to the control terminal of the associated multiplexer.

13. The gate array of claim 12, wherein the logical combination comprises an XOR function.

14. The gate array of claim 13, wherein the programmable function generator comprises an XOR gate having:

a first input terminal selectively coupled to the first output terminal of the CLB or to receive the mode select control signal;

a second input terminal coupled to the second output terminal of the CLB;

and an output terminal coupled to the control terminal of the associated multiplexer.

15. The gate array of claim 14, wherein the programmable function generator further comprises a mode-select multiplexer having:

a first input terminal coupled to the first output terminal of the CLB;

a second input terminal coupled to receive the mode control signal;

an output terminal coupled to the first input terminal of the XOR gate; and a control terminal coupled to receive the mode select control signal.

16. The gate array of claim 14, wherein the programmable function generator further comprises a mode-select multiplexer having:

a first input terminal coupled to the first output terminal of the CLB;

a second input terminal coupled to receive a polarity control signal controlling polarity of a signal on the second output terminal of the CLB;

an output terminal coupled to the first input terminal of the XOR gate; and a control terminal coupled to receive the mode select control signal.

17. The gate array of claim 11, further comprising a plurality of second programmable function generators each having:

an output terminal;

a first input terminal coupled to the first input terminal of the associated multiplexer;

a second input terminal coupled to the control terminal of the associated multiplexer; and a third input terminal coupled to receive the mode select control signal.

18. The gate array of claim 17, wherein:

in a first mode the second programmable function generator provides as an output signal a bus signal received at the first input terminal of the associated multiplexer; and in a second mode the second programmable function generator provides a logical combination of signals received at the associated multiplexer first input and control terminals.

19. The gate array of claim 18, wherein the logical combination comprises an XOR function.

20. The gate array of claim 19, wherein the second programmable function generator comprises an XOR gate having:

a first input terminal coupled to the first input terminal of the associated multiplexer;

a second input terminal selectively coupled to receive either a signal from the control terminal of the associated multiplexer or a predetermined signal; and an output terminal coupled to the output terminal of the second programmable function generator.

21. The gate array of claim 20, wherein the second programmable function generator further comprises a second mode-select multiplexer having:

a first input terminal coupled to receive the predetermined signal;

a second input terminal coupled to receive the signal from the control terminal of the associated multiplexer;

an output terminal coupled to the second input terminal of the XOR gate; and a control terminal coupled to receive the mode select control signal.

22. A field programmable gate array including a Configurable Logic Block (CLB) the gate array, comprising:

means for generating a first carry-out signal based on a carry-in signal from a first another logic block located horizontally adjacent to the CLB;

means for providing the first carry-out signal to a second another logic block located horizontally adjacent to the CLB;

means for generating a second carry-out signal based on a carry-in signal from a third another logic block located vertically adjacent to the CLB; and means for providing the second carry-out signal to a fourth another logic block located vertically adjacent to the CLB.

23. The CLB of claim 22, wherein the means for generating a first carry-out signal comprises:

a multiplexer having a control terminal, a first input terminal, a second input terminal, and an output terminal coupled to a first input terminal of the second another logic block; and a first programmable function generator having a first output terminal coupled to the second input terminal of the multiplexer and a second output terminal coupled to the control terminal of the multiplexer.

24. The CLB of claim 23, wherein the first programmable function generator comprises an XOR function.

25. The CLB of claim 23, wherein the means for generating a first carry-out signal further comprises:

a second programmable function generator having a first input terminal coupled to the first input terminal of the multiplexer and a second input terminal coupled to the control terminal of the multiplexer.

26. The CLB of claim 25, wherein the second programmable function generator comprises an XOR function.

27. The CLB of claim 22, further comprising means for selecting either a first mode or a second mode, wherein:

the means for generating a first carry-out signal and the means for providing the first carry-out signal together form one stage of a horizontal logic chain;

in the first mode, the horizontal logic chain emulates a tristate bus in a horizontal direction across a plurality of logic blocks; and in the second mode, the horizontal logic chain implements a carry logic path in the horizontal direction across the plurality of logic blocks.

28. The CLB of claim 27, wherein the means for generating a first carry-out signal comprises:

a multiplexer having a control terminal, a first input terminal, a second input terminal, and an output terminal coupled to the first input terminal of the second another logic block; and a first programmable function generator having a first output terminal coupled to the second input terminal of the multiplexer and a second output terminal coupled to the control terminal of the multiplexer.

29. The CLB of claim 28, wherein the first programmable function generator comprises an XOR function.

30. The CLB of claim 28, wherein the means for generating a first carry-out signal further comprises:

a second programmable function generator having a first input terminal coupled to the first input terminal of the multiplexer and a second input terminal coupled to the control terminal of the multiplexer.

31. The CLB of claim 30, wherein the second programmable function generator comprises an XOR function.

* * * * *